United States Patent
Uryuu et al.

(10) Patent No.: US 6,933,576 B2
(45) Date of Patent: Aug. 23, 2005

(54) SEMICONDUCTOR DEVICE INCLUDING A PREDETERMINED FILM FORMED AT A BORDER BETWEEN DIELECTRIC FILMS

(75) Inventors: Katsumi Uryuu, Kumamoto (JP); Atsushi Narazaki, Fukuoka (JP)

(73) Assignee: Renesas Technology Corporation, Tokyo (JP)

(*) Notice: Subject to any disclaimer, the term of this patent is extended or adjusted under 35 U.S.C. 154(b) by 0 days.

(21) Appl. No.: 10/681,303

(22) Filed: Oct. 9, 2003

(65) Prior Publication Data

US 2004/0173860 A1 Sep. 9, 2004

(30) Foreign Application Priority Data

Mar. 4, 2003 (JP) ........................................ 2003-056818

(51) Int. Cl.⁷ .................... H01L 21/8238; H01L 29/788
(52) U.S. Cl. ...................... 257/374; 257/317; 257/510; 257/520
(58) Field of Search ................................ 257/314, 317, 257/321, 324, 374, 506, 510, 520, 647

(56) References Cited

U.S. PATENT DOCUMENTS

| 4,477,310 A | * | 10/1984 | Park et al. | .................. | 438/301 |
|---|---|---|---|---|---|
| 4,612,629 A | | 9/1986 | Harari | .................. | 365/185.08 |
| 4,666,556 A | | 5/1987 | Fulton et al. | ................ | 438/431 |
| 5,393,692 A | | 2/1995 | Wu | .............................. | 438/448 |
| 5,798,550 A | | 8/1998 | Kuroyanagi et al. | ......... | 257/341 |
| 2002/0084484 A1 | * | 7/2002 | Kurihara et al. | ............. | 257/315 |

FOREIGN PATENT DOCUMENTS

| DE | 101 57 538 A1 | 6/2003 |
|---|---|---|
| JP | 1-138760 | 5/1989 |
| JP | 4-188772 | 7/1992 |

\* cited by examiner

Primary Examiner—Minhloan Tran
Assistant Examiner—Thomas L. Dickey
(74) Attorney, Agent, or Firm—Oblon, Spivak, McClelland, Maier & Neustadt, P.C.

(57) ABSTRACT

A semiconductor device includes a silicon oxide film (2) formed in a predetermined region on a single crystalline silicon substrate (1) and a gate dielectric film (3) as a thermal oxide film formed by performing thermal oxidation on the surface of the substrate (1) in a region adjacent to the silicon oxide film (2). A polycrystalline silicon (5) (or amorphous silicon) having an oxidized surface is formed on the border between the silicon oxide film (2) and gate dielectric film (3).

8 Claims, 6 Drawing Sheets

F I G . 1 2
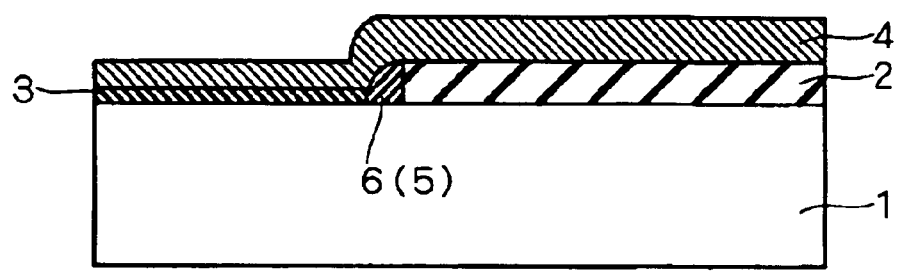

SEMICONDUCTOR DEVICE INCLUDING A PREDETERMINED FILM FORMED AT A BORDER BETWEEN DIELECTRIC FILMS

BACKGROUND OF THE INVENTION

1. Field of the Invention

The present invention relates to a dielectric film configuration of a semiconductor device, and more particularly to a semiconductor device having a dielectric film formed by performing thermal oxidation on the surface of a single crystalline substrate.

2. Description of the Background Art

A semiconductor device having an insulated-gate type device such as MOSFET and IGBT driven by using field effect includes a gate dielectric film formed on a single crystalline substrate such as silicon and a gate electrode formed on the gate dielectric film. The gate dielectric film exerts a great influence upon the performance of such semiconductor device. For achieving stabilized operations of such device, it is preferable that the gate dielectric film should have a great resistance to an electric field (i.e., have a high dielectric withstand voltage) and should be thin. Therefore, a thermal oxide film of uniform properties and thickness is commonly used as such gate dielectric film.

For instance, nonuniformity of such gate dielectric film in thickness with even one portion being extremely thin will lower the dielectric withstand voltage of the entire gate dielectric film. Particularly in recent years, this problem is becoming more serious as gate dielectric films are becoming increasingly thinner.

There is a technique of removing irregularities of configuration of a gate dielectric film for increasing the dielectric withstand voltage (e.g., Japanese Patent Application Laid-Open No. 1-138760 (1989); pp.2–3, FIG. 1).

A thermal oxide film used as the gate dielectric film is formed thin on the surface of a single crystalline substrate by creating a chemical bond between the surface of the single crystalline substrate and oxygen by heat treatment in an oxidizing environment. That is, the thermal oxide film is generated by a chemical bond between oxygen and a substrate material (e.g., silicon), and is thus not formed in a region unexposed to the outside of the single crystalline substrate. Further, the thermal oxide film is difficult to form in a region where some shield interferes with a sufficient supply of oxygen or a substrate material to be bonded to oxygen.

Therefore, when another dielectric film formed in a previous step, for example, exists in a region where the thermal oxide film is to be formed, it is difficult to supply a substrate material necessary for thermal oxidation in the vicinity of such dielectric film formed in the previous step, causing a boundary portion of the thermal oxide film with respect to the dielectric film to be locally reduced in film thickness. Through the use of such thermal oxide film as the gate dielectric film, a high gate dielectric withstand voltage is not available, preventing stabilized operations of a semiconductor device, which results in degraded operational reliability.

For instance, in a manufacturing step of a power MOSFET which is one of insulated-gate type devices, a dielectric film for maintaining a withstand voltage at an edge part of a semiconductor chip is formed on a single crystalline silicon substrate, and thereafter, a gate dielectric film in contact thereto is formed by thermal oxidation. This causes a boundary portion of the gate dielectric film with respect to the dielectric film previously formed to be locally reduced in film thickness, resulting in the above-described problem.

SUMMARY OF THE INVENTION

An object of the present invention is to achieve improved operational reliability of a semiconductor device by improving the dielectric withstand voltage of a thermal oxide film used as a gate dielectric film or the like.

According to a first aspect of the invention, the semiconductor device includes a first dielectric film formed in a first region on a single crystalline substrate and a second dielectric film formed in a second region on the single crystalline substrate adjacent to the first region. The semiconductor device also includes a predetermined film made of one of a polycrystalline material and an amorphous material, formed at the border between the first and second dielectric films. At least a surface of the predetermined film is oxidized.

According to a second aspect of the invention, a method of manufacturing a semiconductor device includes the following steps (a) through (d). The step (a) is to form a first dielectric film in a first region on a single crystalline substrate. The step (b) is to form a second dielectric film by performing thermal oxidation on a surface of a second region on the single crystalline substrate adjacent to the first region. The step (c) is to form a predetermined film made of one of a polycrystalline material and an amorphous material at the border between the first and second regions. The step (d) is to perform thermal oxidation at least on a surface of the predetermined film.

Degradation in the dielectric withstand voltage at the border between the first and second dielectric films is prevented. This contributes to stabilized operations of a semiconductor device, for example, including an insulated-gate type device having a gate dielectric film as the second dielectric film, which can achieve improved operational reliability. The use of an amorphous film as the predetermined film further increases this effect.

Further, an increase in the number of manufacturing steps is minimized as compared to a conventional method of manufacturing a semiconductor device. For instance, the formation of the first dielectric film and the thermal oxidation of the predetermined film may be performed at the same time. Besides, the formation of the predetermined film at the same time with the formation of other devices on the substrate prevents an increase in the number of manufacturing steps as compared with conventional manufacturing steps.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 11 and 12 illustrate variations of the fourth preferred embodiment.

DESCRIPTION OF THE PREFERRED EMBODIMENTS

First Preferred Embodiment

Figure 1:
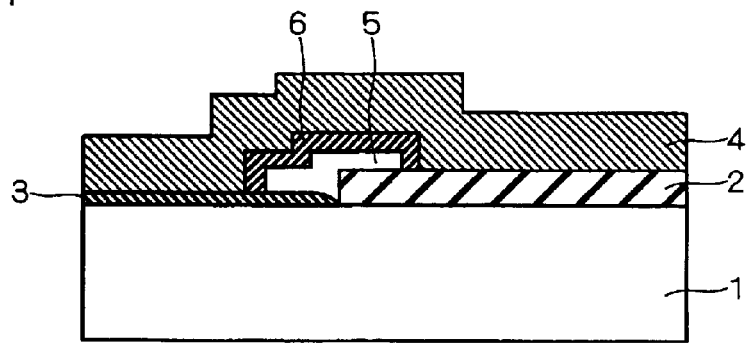
FIG. 1 illustrates the structure of a semiconductor device according to a first preferred embodiment of the present invention.

FIG. 1 illustrates the structure of a semiconductor device according to a first preferred embodiment of the present invention. A semiconductor device having an insulated-gate type device is illustrated by way of example. This semiconductor device includes a silicon oxide film 2 in a predetermined region on a single crystalline silicon substrate 1. A dielectric film for maintaining a withstand voltage at an edge part of a semiconductor chip is an example of the silicon oxide film 2. In a region adjacent to the silicon oxide film 2 on the single crystalline silicon substrate 1, a gate dielectric film 3 is formed which is a thermal oxide film generated by performing thermal oxidation on the surface of the substrate 1.

A polycrystalline silicon 5 having an oxidized surface is formed at the border between the silicon oxide film 2 and gate dielectric film 3. A reference numeral 6 in FIG. 1 indicates an oxidized portion of the polycrystalline silicon 5 (i.e., silicon oxide film). That is, the silicon oxide film 6 is obtained by performing thermal oxidation on the surface of the polycrystalline silicon 5. A gate electrode 4 is formed on the gate dielectric film 3, silicon oxide film 6 and silicon oxide film 2. The silicon oxide film 6 covers the surface of the polycrystalline silicon 5 and connects the gate dielectric film 3 and silicon oxide film 2 as shown in FIG. 1. Thus, the single crystalline silicon substrate 1 and gate electrode 4 are insulated from each other by the silicon oxide film 2, gate dielectric film 3 and silicon oxide film 6.

Figure 2A:
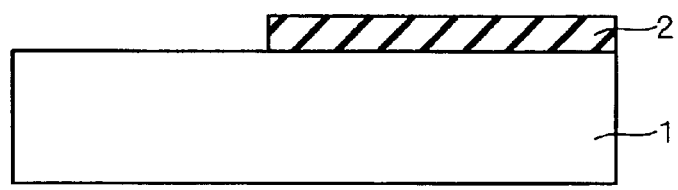
FIGS. 2A through 3C illustrate manufacturing steps of the semiconductor device according to the first preferred embodiment.

Hereinafter, manufacturing steps of the semiconductor device shown in FIG. 1 will be described. First, as shown in FIG. 2A, the silicon oxide film 2 is formed in a predetermined region on the single crystalline silicon substrate 1. Formation of a pn junction for forming a transistor and the like are usually performed before or after this step, explanation of which is omitted here and only steps relevant to the present invention will be described.

Figure 2B:
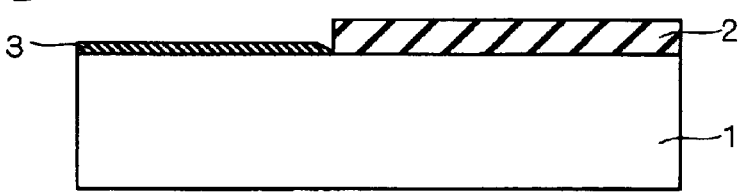

Next, the surface of the single crystalline substrate 1 is subjected to heat treatment in an oxidizing environment so as to be thermally oxidized, thereby forming the gate dielectric film 3. At this time, the amount of supply of silicon from the single crystalline silicon substrate 1 in the vicinity of the silicon oxide film 2 is so small that a chemical bond between oxygen and silicon is not sufficiently created. This causes a boundary portion of the gate dielectric film 3 with respect to the silicon oxide film 2 to be locally reduced in film thickness as shown in FIG. 2B. Conventionally, a gate electrode is formed directly on the gate dielectric film 3 of this type, causing the dielectric withstand voltage at the boundary portion of the gate dielectric film 3 with respect to the silicon oxide film 2 to be lowered, resulting in unstabilized device operations.

Figure 2C:
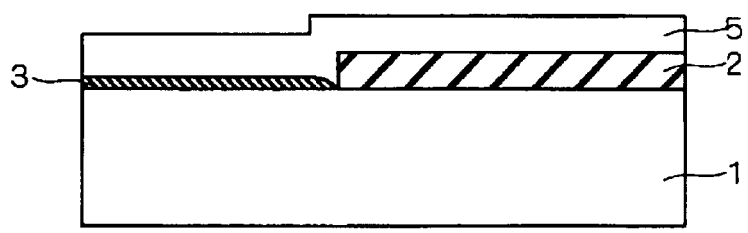
Figure 3A:
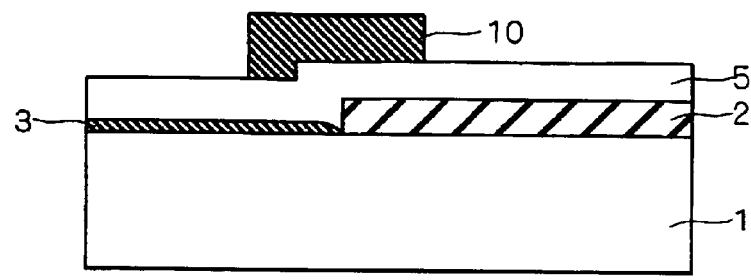
Figure 3B:
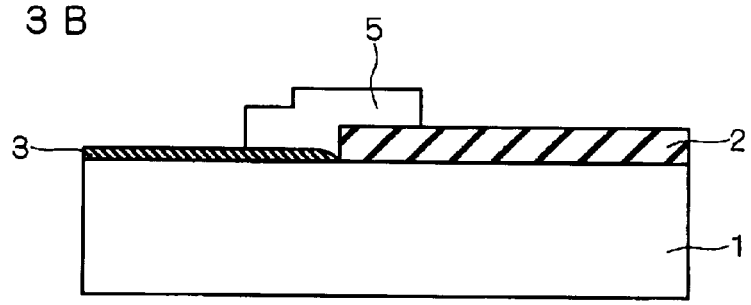
Figure 3C:
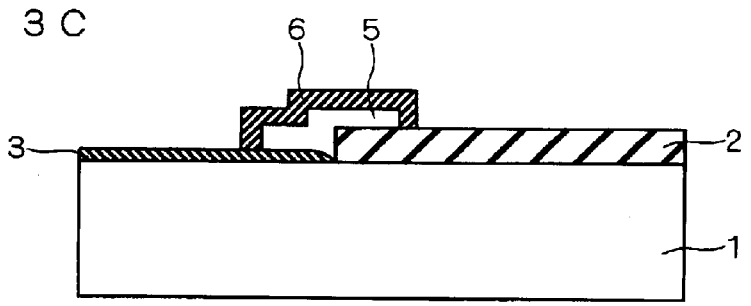

In the present embodiment, after the gate dielectric film 3 is formed, the polycrystalline silicon 5 is formed on the silicon oxide film 2 and gate dielectric film 3 as shown in FIG. 2C. Then, as shown in FIG. 3A, a resist mask 10 is formed above the border between the silicon oxide film 2 and gate dielectric film 3, and the polycrystalline silicon 5 is selectively etched for patterning using the resist mask 10 as a mask. As a result, part of the polycrystalline silicon 5 remains at the border between the silicon oxide film 2 and gate dielectric film 3 as shown in FIG. 3B. Thermal oxidation is thereafter performed on the surface of the polycrystalline silicon 5 as shown in FIG. 3C, thereby forming the silicon oxide film 6. Since the polycrystalline silicon 5 is oxidized at higher speeds than a single crystalline silicon, the silicon oxide film 6 having a sufficient thickness and a high dielectric withstand voltage can be obtained through heat treatment for a relatively short period of time.

Finally, the gate electrode 4 is formed on the gate dielectric film 3, silicon oxide film 6 and silicon oxide film 2 from a predetermined material (e.g., polycrystalline silicon, metal, etc.). The semiconductor device structure shown in FIG. 1 is thereby obtained.

As described, according to the present embodiment, the silicon oxide film 6 having a dielectric withstand voltage of sufficient degree is formed to cover the boundary portion of the gate dielectric film 3 with respect to the silicon oxide film 2 which is locally reduced in thickness. As a result, this prevents degradation in the dielectric withstand voltage of the gate dielectric film 3, contributing to stabilized device operations, which can achieve improved operational reliability.

Amorphous silicon may be used instead of the polycrystalline silicon 5 formed at the border between the silicon oxide film 2 and gate dielectric film 3, having the silicon oxide film 6 formed on its surface by thermal oxidation. Since polycrystalline silicon has gaps between crystals with crystal grains being nonuniform in size, degradation in the dielectric withstand voltage due to nonuniformity in film thickness and cracks easily occurs in a thermal oxide film to be formed on such polycrystalline silicon. On the other hand, since amorphous silicon has no crystal grain, nonuniformity in film thickness and cracks are difficult to occur in a thermal oxide film to be formed of such amorphous silicon. That is, the use of amorphous silicon instead of the above-described polycrystalline silicon 5 allows the silicon oxide film 6 to have excellent film properties, which can further improve operational reliability of a semiconductor device.

Second Preferred Embodiment

Although the method according to the first preferred embodiment can prevent degradation in the dielectric withstand voltage of the gate dielectric film 3, there is a concern about an increase in the number of manufacturing steps. Thus, the present embodiment will describe a semiconductor device that can be formed through a less number of steps and is capable of achieving the same effect as in the first preferred embodiment, and a method of manufacturing such semiconductor device.

Figure 4:
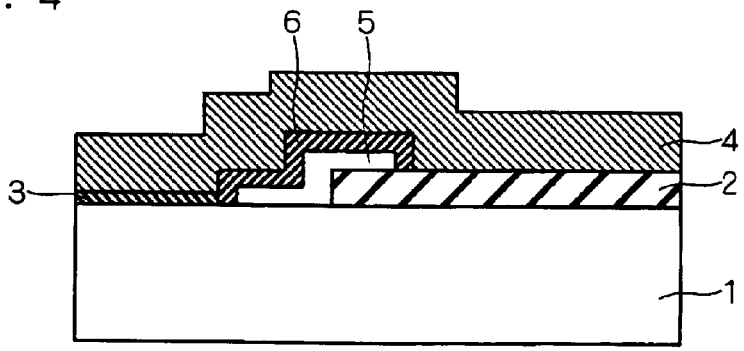
FIG. 4 illustrates the structure of a semiconductor device according to a second preferred embodiment of the invention.

FIG. 4 illustrates the structure of the semiconductor device according to the present embodiment. In FIG. 4, the same components as in FIG. 1 are designated by the same reference numerals, repeated explanation of which is thus omitted here. The structure shown in FIG. 4 differs from that of FIG. 1 in that the gate dielectric film 3 is not formed under the polycrystalline silicon 5 and silicon oxide film 6. That is, the polycrystalline silicon 5 has a portion interposed between the silicon oxide film 2 and gate dielectric film 3 at the border between the silicon oxide film 2 and gate dielectric film 3.

Figure 5A:
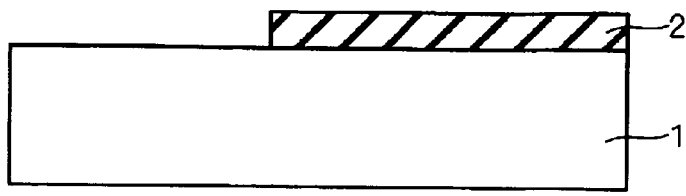
FIGS. 5A through 6C illustrate manufacturing steps of the semiconductor device according to the second preferred embodiment.

Hereinafter, the manufacturing method of the semiconductor device shown in FIG. 4 will be described. Explanation of formation of a pn junction for forming a transistor and the like is omitted here and only steps relevant to the present invention will be described. First, as shown in FIG. 5A, the silicon oxide film 2 is formed in a predetermined region on the single crystalline silicon substrate 1.

Figure 5B:
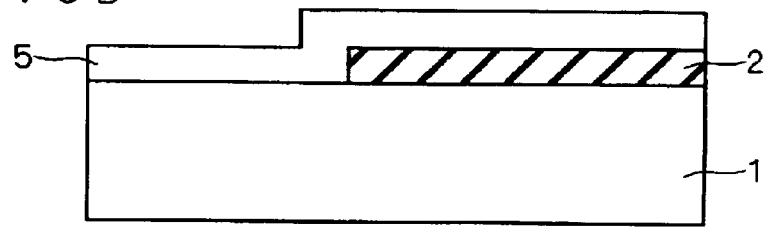
Figure 6A:
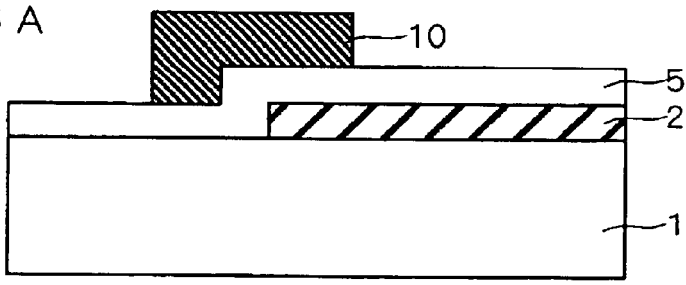
Figure 6B:
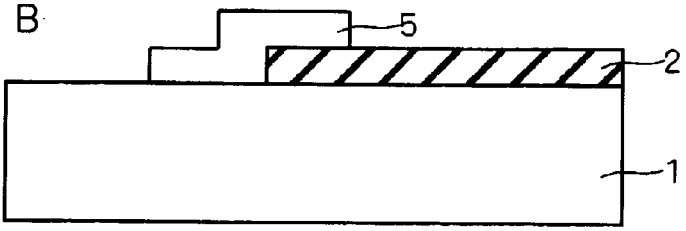

Next, as shown in FIG. 5B, the polycrystalline silicon 5 is formed on the single crystalline silicon substrate 1 and silicon oxide film 2. Then, as shown in FIG. 6A, the resist mask 10 is formed above the border between the silicon oxide film 2 and a region where the gate dielectric film 3 is to be formed, and the polycrystalline silicon 5 is selectively etched for patterning using the resist mask 10 as a mask. As a result, part of the polycrystalline silicon 5 remains at the above-described border as shown in FIG. 6B.

Figure 6C:
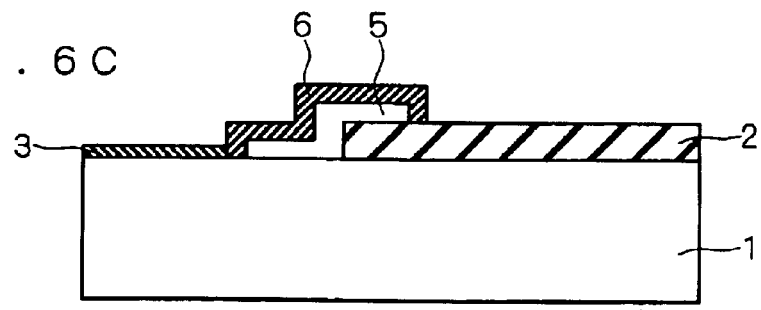

Then, heat treatment is performed in an oxidizing environment to form the gate dielectric film 3 on the surface of the single crystalline silicon substrate 1 as well as to form the silicon oxide film 6 on the surface of the polycrystalline silicon 5, as shown in FIG. 6C. At this time, silicon is supplied from both the single crystalline silicon substrate 1 and polycrystalline silicon 5 at the border between the region where the gate dielectric film 3 is to be formed and polycrystalline silicon 5, which prevents the gate dielectric film 3 from being locally reduced in thickness. Further, since the polycrystalline silicon 5 is oxidized at high speeds, the silicon oxide film 6 can have a sufficient thickness and a high dielectric withstand voltage.

Finally, the gate electrode 4 is formed on the silicon oxide film 2, gate dielectric film 3 and silicon oxide film 6 from a predetermined material. The semiconductor device structure shown in FIG. 4 is thereby obtained.

As described, according to the present embodiment, the gate dielectric film 3 and silicon oxide film 6 are formed in the same step of thermal oxidation, which can prevent an increase in the number of manufacturing steps. Further, if it is possible to form and pattern the polycrystalline silicon 5 at the same time with a step of forming other devices (e.g., Zener diodes using polycrystalline silicon, etc.), the number of manufacturing steps of the semiconductor device never increases as a whole. Furthermore, an edge part of the gate dielectric film 3 can be prevented from being formed locally thin, and the silicon oxide film 6 having a dielectric withstand voltage of sufficient degree is formed at the border between the gate dielectric film 3 and silicon oxide film 2. This prevents degradation in the dielectric withstand voltage of the gate dielectric film 3, contributing to improved operational reliability of the semiconductor device.

Amorphous silicon may also be used instead of the polycrystalline silicon 5 in the present embodiment. This allows the silicon oxide film 6 to have excellent film properties, which can further improve operational reliability of the semiconductor device.

Third Preferred Embodiment

In the first and second preferred embodiments, thermal oxidation is performed on the surface of the polycrystalline silicon 5 to form the silicon oxide film 6. The polycrystalline silicon 5 under the silicon oxide film 6 in FIG. 4, for example, is of the same potential as the single crystalline silicon substrate 1. In this case, there is a concern that applying voltage of a predetermined value to the gate electrode 4 may cause electric field concentration resulting from the configuration of the polycrystalline silicon 5, resulting in a degraded gate dielectric withstand voltage.

Figure 7:
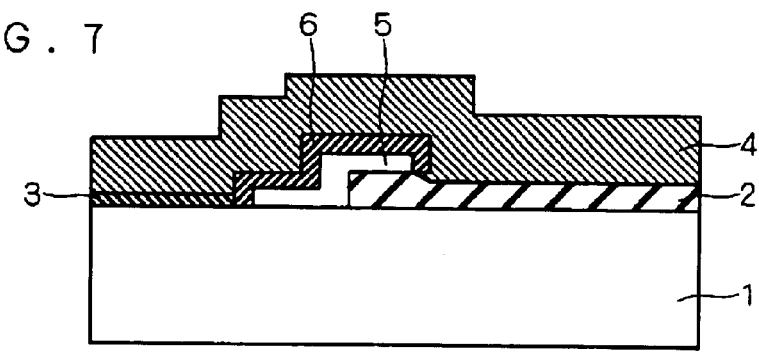
FIG. 7 is an explanatory view of problem encountered in the first and second preferred embodiments.

Further, in the manufacturing steps according to the first and second preferred embodiments, the polycrystalline silicon 5 is formed on the silicon oxide film 2 and is thereafter selectively etched for patterning, as shown in FIGS. 6A and 6B. At this time, the top surface of the silicon oxide film 2 is also selectively etched due to over-etching. This creates a step difference on the silicon oxide film 2 at the edge part of the polycrystalline silicon 5 in the semiconductor device according to the present invention, as shown in FIG. 7, and the dielectric withstand voltages of the gate electrode 4 and polycrystalline silicon 5 degrade at the step difference. At worst, a gap is generated between the silicon oxide films 2 and 6, causing the single crystalline silicon substrate 1 and gate electrode 4 to become shorted to each other through the polycrystalline silicon 5, which results in loss of the function of the gate dielectric film 3.

Therefore, in the present embodiment, the polycrystalline silicon 5 is entirely oxidized in the step of thermal oxidation as described in the first and second preferred embodiments. That is, the silicon oxide film 6 is formed not only on the surface of the polycrystalline silicon 5 but also in the entire polycrystalline silicon 5. As a result, as shown in FIG. 8, the silicon oxide film 6 is formed at the border between the silicon oxide film 2 and gate dielectric film 3 by performing thermal oxidation on the entire polycrystalline silicon 5.

The polycrystalline silicon 5 entirely becomes the silicon oxide film 6, which can solve the above-described problems. That is, electric field concentration is prevented, and the gate dielectric withstand voltage does not degrade even if a step difference is created on the silicon oxide film 2 due to over-etching.

Figure 8:
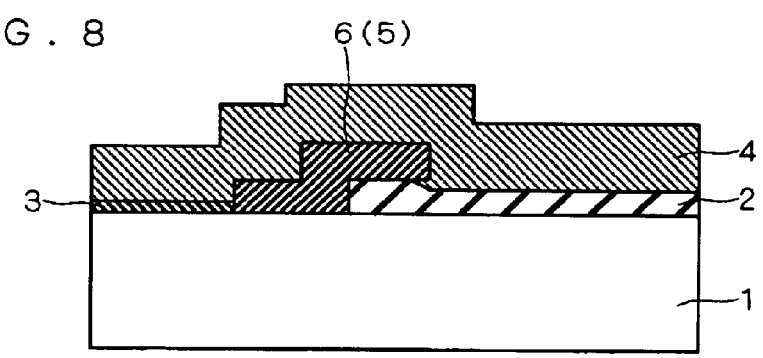
FIG. 8 illustrates the structure of a semiconductor device according to a third preferred embodiment of the invention.

Although FIG. 8 illustrates the structure where the present invention is applied to the second preferred embodiment, it is apparent that the present invention is also applicable to the first preferred embodiment as described above. In that case, the silicon oxide film 6 is formed in the entire polycrystalline silicon 5 shown in FIG. 1.

Fourth Preferred Embodiment

As described in the third preferred embodiment, in the first and second preferred embodiments, the polycrystalline silicon 5 is formed on the silicon oxide film 2 and is selectively etched for patterning, which results in a step difference on the silicon oxide film 2 due to over-etching.

The silicon oxide film 2 is used as a field plate in some cases. Providing the polycrystalline silicon 5 of the same potential as the single crystalline silicon substrate 1 on the top surface of the silicon oxide film 2 as shown in FIG. 4 may exert an adverse influence upon the function of the silicon oxide film 2 as the field plate.

Figure 9:
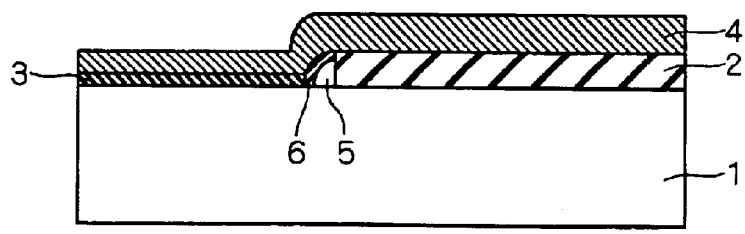
FIG. 9 illustrates the structure of a semiconductor device according to a fourth preferred embodiment of the invention.

FIG. 9 illustrates the structure of a semiconductor device according to the present embodiment. In FIG. 9, the same components as in FIG. 1 are designated by the same reference numerals, repeated explanation of which is thus omitted here. As illustrated, the polycrystalline silicon 5 with the silicon oxide film 6 formed on its surface is formed on a side surface of the silicon oxide film 2.

Figure 10A:
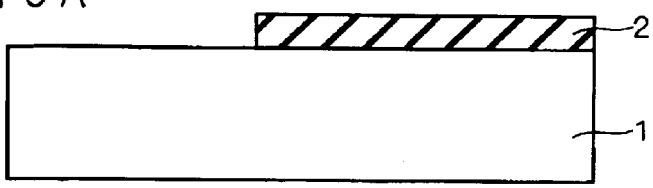
FIGS. 10A through 10D illustrate manufacturing steps of the semiconductor device according to the fourth preferred embodiment.

Hereinafter, manufacturing steps of the semiconductor device shown in FIG. 9 will be described. Explanation of formation of a pn junction for forming a transistor and the like is omitted here and only steps relevant to the present invention will be described. First, as shown in FIG. 10A, the silicon oxide film 2 is formed in a predetermined region on the single crystalline silicon substrate 1.

Figure 10B:
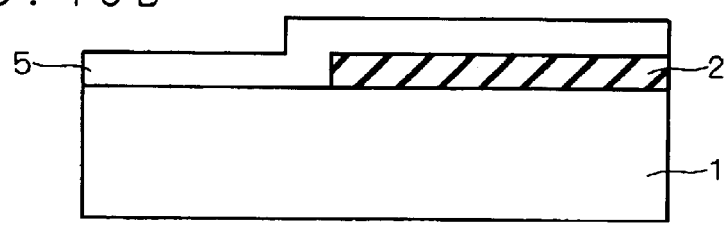
Figure 10C:
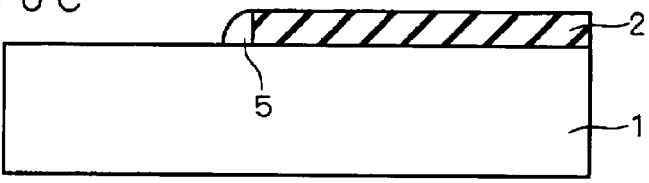

Next, the polycrystalline silicon 5 is formed on the single crystalline silicon substrate 1 and silicon oxide film 2 as shown in FIG. 10B. The polycrystalline silicon 5 is then etched back on its entire surface so as to remain only on the side surface of the silicon oxide film 2 as shown in FIG. 10C.

Figure 10D:
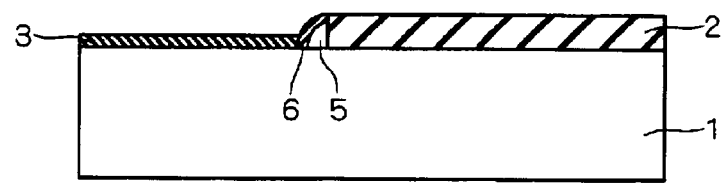

Subsequently, heat treatment is performed in an oxidizing environment to form the gate dielectric film 3 on the surface of the single crystalline silicon substrate 1 as well as to form the silicon oxide film 6 on the surface of the polycrystalline silicon 5, as shown in FIG. 10D. At this time, silicon is supplied from both the substrate 1 and polycrystalline silicon 5 at the border between the region where the gate dielectric film 3 is to be formed and polycrystalline silicon 5, which prevents the gate dielectric film 3 from being locally reduced in thickness. Further, since the polycrystalline silicon 5 is oxidized at high speeds, the silicon oxide film 6 can have a sufficient thickness and a high dielectric withstand voltage.

Finally, the gate electrode 4 is formed on the gate dielectric film 3, silicon oxide film 6 and silicon oxide film 2 from a predetermined material. The semiconductor device structure shown in FIG. 9 is thereby obtained.

As described, according to the present embodiment, the polycrystalline silicon 5 is not selectively etched but entirely etched back so as to be formed on the side surface of the silicon oxide film 2. Thus, no step difference is created on the top surface of the silicon oxide film 2. Further, since part of the polycrystalline silicon 5 on the silicon oxide film 2 is removed, the function of the silicon oxide film 2 as the field plate is less affected.

Figure 11:
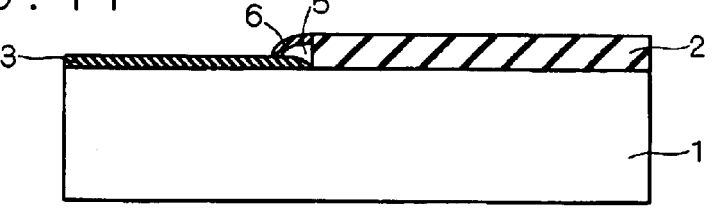

Further, as in the second preferred embodiment, the gate dielectric film 3 and silicon oxide film 6 are formed in the same step of thermal oxidation, which can prevent an increase in the number of manufacturing steps. Of course, as in the first preferred embodiment, the polycrystalline silicon 5 and silicon oxide film 6 may be formed after forming the gate dielectric film 3. In that case, the device structure is as shown in FIG. 11. Moreover, as in the first and second preferred embodiments, it is needless to say that degradation in the dielectric withstand voltage of the gate dielectric film 3 is prevented, contributing to improved operational reliability of the semiconductor device.

Furthermore, as in the third preferred embodiment, the polycrystalline silicon 5 may be entirely oxidized in the step of performing thermal oxidation on the polycrystalline silicon 5. That is, the silicon oxide film 6 may be formed not only on the surface of the polycrystalline silicon 5 but also in the entire polycrystalline silicon 5. The resulting structure is illustrated in FIG. 12. This prevents electric field concentration, and further suppresses degradation in the gate dielectric withstand voltage.

Although the above description has been directed to a single crystalline silicon substrate as single crystalline substrate and polycrystalline silicon or amorphous silicon as a predetermined polycrystalline or amorphous film by way of example, the present invention is not limited to these materials but is widely applicable to other single crystalline substrate materials and polycrystalline or amorphous materials.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
  a first dielectric film formed in a first region on a single crystalline substrate;
  a second dielectric film formed in a second region on said single crystalline substrate adjacent to said first region; and
  a predetermined film made of a polycrystalline material and formed at a border between said first and second dielectric films, at least a surface of said predetermined film being oxidized.

2. The semiconductor device according to claim 1, wherein
  said first dielectric film is thicker than said second dielectric film, and
  said predetermined film is formed on a side surface of said first dielectric film.

3. The semiconductor device according to claim 1, wherein
  said predetermined film has a portion interposed between said first and second dielectric films at said border.

4. A semiconductor device comprising:
  a first dielectric film formed in a first region on a single crystalline substrate and in direct contact with said single crystalline substrate;
  a second dielectric film formed in a second region on said single crystalline substrate adjacent to said first region and in direct contact with said single crystalline substrate; and
  a predetermined film made of an amorphous material and formed at a border between said first and second dielectric films, at least a surface of said predetermined film being oxidized,
  wherein said first dielectric film is thicker than said second dielectric film, and
  said predetermined film is formed on a side surface of said first dielectric film and is not formed on a top surface of said first dielectric film.

5. The semiconductor device of claim 4, wherein said predetermined film has a portion interposed between said first and second dielectric films at said border and in direct contact with said single crystalline substrate.

6. The semiconductor device according to claim 4, wherein said predetermined film is entirely oxidized.

7. A semiconductor device comprising:
  a first dielectric film formed in a first region on a single crystalline substrate and in direct contact with said single crystalline substrate;
  a second dielectric film formed in a second region on said single crystalline substrate adjacent to said first region and in direct contact with said single crystalline substrate; and
  a predetermined film which is made of an amorphous material, formed at a border between said first and second dielectric films, at least a surface of said predetermined film being oxidized,
  wherein said predetermined film has a portion interposed between said first and second dielectric films at said border and in direct contact with said single crystalline substrate.

8. The semiconductor device according to claim 7, wherein said predetermined film is entirely oxidized.

* * * * *